(12) United States Patent
Wohlfeil et al.

(10) Patent No.: US 11,846,559 B2
(45) Date of Patent: Dec. 19, 2023

(54) METHOD AND DEVICE FOR DETECTING ABSOLUTE OR RELATIVE TEMPERATURE AND/OR ABSOLUTE OR RELATIVE WAVELENGTH

(71) Applicant: Adtran Networks SE, Meiningen (DE)

(72) Inventors: Benjamin Wohlfeil, Berlin (DE); Gilda Raoof Mehrpoor, Nuremberg (DE)

(73) Assignee: Adtran Networks SE, Meiningen (DE)

( * ) Notice: Subject to any disclaimer, the term of this patent is extended or adjusted under 35 U.S.C. 154(b) by 0 days.

(21) Appl. No.: 17/545,202

(22) Filed: Dec. 8, 2021

(65) Prior Publication Data
US 2022/0178786 A1 Jun. 9, 2022

(30) Foreign Application Priority Data
Dec. 9, 2020 (EP) ..................................... 20212879

(51) Int. Cl.
*G01M 11/02* (2006.01)
*G01K 11/32* (2021.01)
(Continued)

(52) U.S. Cl.
CPC ....... *G01M 11/0207* (2013.01); *G01J 9/0246* (2013.01); *G01K 11/32* (2013.01);
(Continued)

(58) Field of Classification Search
CPC ............. G01M 11/02; G01M 11/0207; G01M 11/022808; G01M 11/083; G01M 11/085;
(Continued)

(56) References Cited

U.S. PATENT DOCUMENTS

| | | | | |
|---|---|---|---|---|
| 4,775,214 A | * | 10/1988 | Johnson | G01D 5/344 385/11 |
| 5,009,505 A | * | 4/1991 | Malvern | G01B 11/18 374/E11.015 |

(Continued)

FOREIGN PATENT DOCUMENTS

| | | | | |
|---|---|---|---|---|
| CN | 101299650 A | * | 11/2008 | |
| CN | 108645601 B | * | 11/2019 | ........ G01M 11/0207 |
| KR | 101480101 B1 | * | 1/2015 | |

OTHER PUBLICATIONS

Breglio et al., "Temperature Optical Sensor based on a Silicon Bi-Modal Y Branch", Silicon-based and Hybrid Optoelectronics III, International Society for Optics and Photonics, 2001, pp. 155-161, vol. 4293.

(Continued)

*Primary Examiner* — Gordon J Stock, Jr.
(74) *Attorney, Agent, or Firm* — THE WEBB LAW FIRM

(57) ABSTRACT

An optical detection device and method for detecting temperature changes and/or wavelength changes of an optical probe signal includes transmitting an optical probe signal having a predetermined wavelength to an optical input port of an optical waveguide; detecting first and second optical detection signal at first and second optical output ports via first and second opto-electrical converters which create corresponding first and second electrical signals; measuring values of the first and second electrical signal and determining an absolute temperature or a temperature change of the optical waveguide and/or an absolute wavelength value or a wavelength change of the optical probe signal via values measured of the first and second electrical signals and first and second previously determined wavelengths and temperature dependencies of both first and second power transfer functions.

9 Claims, 6 Drawing Sheets

(51) Int. Cl.
*G01M 11/00* (2006.01)
*G01J 9/02* (2006.01)
*H01S 5/0683* (2006.01)
*H01S 5/0687* (2006.01)

(52) U.S. Cl.
CPC ........ *G01M 11/0228* (2013.01); *G01M 11/33* (2013.01); *H01S 5/0683* (2013.01); *H01S 5/0687* (2013.01); *H01S 5/06837* (2013.01)

(58) Field of Classification Search
CPC .. G01M 11/086; G01M 11/088; G01M 11/30; G01M 11/33; G01M 11/331; G01M 11/332; G01M 11/333; G01M 11/334; G01M 11/335; G01M 11/336; G01M 11/337; G01M 11/338; G01M 11/0228; G01M 11/08; G01K 11/00; G01K 11/32; G01K 11/3206; G01K 11/3213; G01K 11/322; G01K 11/324; G01K 15/005; G01K 15/007; G01D 5/26; G01D 5/264; G01D 5/268; G01D 5/32; G01D 5/34; G01D 5/353; G01D 5/35306; G01D 5/35329; G01D 5/35341; G01D 5/35345; G01D 5/3537; G02B 6/29335; G02B 6/29338; G02B 6/2934; G02B 6/29341; G02B 6/29343; H01S 5/068; H01S 5/06804; H01S 5/0683; H01S 5/06837; H01S 5/0687; G01J 9/0246; G01J 2009/0273
See application file for complete search history.

(56) References Cited

U.S. PATENT DOCUMENTS

| | | | |
|---|---|---|---|
| 6,243,506 B1 | 6/2001 | Wu et al. | |
| 6,483,956 B1* | 11/2002 | Shevy | H01S 5/0687 385/11 |
| 7,446,880 B2* | 11/2008 | Vollmer | G01N 21/7746 356/519 |
| 8,111,402 B2* | 2/2012 | Le | G01N 21/7703 356/491 |
| 8,340,478 B2* | 12/2012 | Popovic | G02B 6/12007 385/32 |
| 8,351,473 B1* | 1/2013 | Darcie | H01S 5/0687 372/20 |
| 9,052,291 B2* | 6/2015 | He | H01P 7/00 |
| 9,726,553 B2 | 8/2017 | Ahmed et al. | |
| 10,141,710 B2* | 11/2018 | Bovington | H01S 5/1071 |
| 11,050,214 B2* | 6/2021 | Loh | H01S 3/094069 |
| 11,255,746 B2* | 2/2022 | Ahmed | G02B 1/005 |
| 11,536,610 B2* | 12/2022 | Zeiler | G01J 3/45 |
| 2011/0103415 A1 | 5/2011 | Rasras | |
| 2017/0324218 A1* | 11/2017 | Krishnamoorthy | H01S 3/10069 |

OTHER PUBLICATIONS

Irace et al., "All-silicon optical temperature sensor based on Multi-Mode Interference", Optics Express, Optical Society of America, 2003, pp. 2807-2812, vol. 11, No. 22.

Kim et al., "Silicon photonic temperature sensor employing a ring resonator manufactured using a standard CMOS process", Optics Express, Optical Society of America, 2010, pp. 22215-22221, vol. 18, No. 21.

* cited by examiner

METHOD AND DEVICE FOR DETECTING ABSOLUTE OR RELATIVE TEMPERATURE AND/OR ABSOLUTE OR RELATIVE WAVELENGTH

CROSS-REFERENCE TO RELATED APPLICATION

This application claims priority to European Patent Application No. 20212879.9 filed Dec. 9, 2020, the disclosure of which is hereby incorporated by reference in its entirety.

BACKGROUND OF THE INVENTION

Field of the Invention

The invention relates to a method for detecting the absolute temperature or temperature changes, e.g. of a device or the environment, using an optical waveguide structure, and/or the absolute wavelength or wavelength changes of an optical probe signal that is fed to the optical waveguide structure. The invention further relates to an optical detection device that realizes this method.

Description of Related Art

The scientific literature describes a few approaches of detecting temperature of a photonic integrated circuit. It is known to use the thermo-optic effect, i.e. the temperature dependency of the refractive index, in multimode waveguide structures such as a y-branch and a multi-mode interference (MMI) coupler, respectively, to alter the transmission spectra of the respective devices (e.g. Breglio, Giovanni et al., "Temperature optical sensor based on a silicon bimodal Y branch", Silicon-based and Hybrid Optoelectronics III, Vol. 4293, International Society for Optics and Photonics, 2001; Irace, Andrea, Giovanni Breglio, "All-silicon optical temperature sensor based on Multi-Mode Interference", Optics express 11.22 (2003), pp. 2807-2812). Kim, Gun-Duk, et al., "Silicon photonic temperature sensor employing a ring resonator manufactured using a standard CMOS process", Optics express 18.21 (2010), pp. 22215-22221 describes a ring resonator using single mode integrated waveguides that achieves a similar goal, albeit with much greater effect. By means of thorough calibration, it is therefore possible to detect temperature or temperature variations by measuring optical intensity.

However, these approaches cannot be used to isolate temperature variations from other effects that influence the optical intensity at the detector, such as output power variations of the light source or changes in optical coupling between light source and a photonic integrated circuit (PIC) that comprises the temperature-dependent optical structure or between the PIC and the detector for measuring the optical intensity of an optical probe signal that is transmitted through the PIC. Such changes of the coupling efficiency can for example be caused by mechanical stress that is exerted onto the optical coupling.

Further, using these approaches, it is also impossible to distinguish between optical intensity (power) variations that are caused by temperature changes due to variations of the wavelength of the optical probe signal.

It shall be mentioned, for reasons of clarity, that, within this description, the term "optical intensity", which generally means the optical power transported per unit area, is used as an equivalent to the term "optical (average) power", as the cross-sectional area of an optical waveguide, in which the respective optical signal is guided, is so small that the optical intensity transported in the whole cross-sectional area is detected.

SUMMARY OF THE INVENTION

It is thus an object of the present invention to provide a method for detecting the absolute temperature or temperature changes and/or the absolute wavelength or wavelength changes of an optical probe signal with improved accuracy or without requiring either a temperature-stabilized optical detection device or a wavelength-stabilized optical probe signal. It is a further object of the invention to provide an optical detection device which is configured to implement the method according to the invention.

The invention achieves these objects with the combination of features as described herein. Further embodiments are apparent from the dependent claims.

The invention starts from the finding that two differing wavelength and temperature dependencies can be used in order to determine both parameters, wavelength and temperature or corresponding changes.

The method uses an optical detection device comprising an optical waveguide structure defining an optical input port adapted to receive an optical probe signal and a first and a second optical output port adapted to output a first and a second optical detection signal, respectively, as a response to the optical probe signal. The optical waveguide structure is configured in such a way that a first power transfer function characterizing the transmission of the optical probe signal from the optical input port to the first optical output port differs, with respect to its wavelength and temperature dependency, from a second power transfer function characterizing the transmission of the optical probe signal from the optical input port to the second optical output port. The method comprises the steps of transmitting the probe signal having a predetermined—not necessarily constant—wavelength to the optical input port, detecting the first and second optical detection signal at the first and second optical output port by means of a first and second opto-electrical converter creating a first and second electrical signal corresponding to the optical power of the respective first or second optical detection signal, measuring values of the first and second electrical signal and determining an absolute temperature value or a value of a temperature change of the optical waveguide structure and/or an absolute wavelength value or a value of a wavelength change of the optical probe signal by using the values measured of the first and second electrical signal and a first and a second previously determined wavelength and temperature dependency of both the first and second power transfer function.

If a pair of measured power values, each of which is defined by the respective first or second power transfer function, shall lead to a unique pair of values for the parameters wavelength and temperature, it is necessary that the two differing power transfer functions define a mapping rule for the parameters wavelength and temperature (at least within a predetermined range for each of the parameters) that bijectively maps pairs of values of wavelength and temperature to (differing) pairs of values of the power transfer functions. In other words, the mapping rule must be invertible at least for a given (interesting) range (mathematically correct "domain") for each of the parameters wavelength and temperature.

This method makes it possible to determine values for the temperature or values for temperature changes even if the wavelength of the optical probe signal is not kept constant, i.e. wavelength variations can be compensated. Likewise, the method makes it possible to determine values for the wavelength or values for wavelength changes even if the temperature of the optical detection device is not kept constant, i.e. temperature variations can be compensated. Of course, in general, both parameters or changes of both parameters can be determined by measuring the respective intensity values.

According to an embodiment of the invention, the first and second wavelength and temperature dependency of the first and second power transfer function is determined by means of a calibration process, wherein the calibration process comprises the steps of according to a brute force alternative, measuring values of the first and second electrical signal while varying the temperature and the wavelength within a respective predetermined temperature and wavelength range, or according to a simulation alternative, performing a multi-dimensional simulation in order to determine simulated dependencies of the first and second power transfer function that depend on temperature and wavelength as well as on a respective n-dimensional parameter vector p and q, respectively, measuring values of the first and second electrical signal for one or more predetermined pairs of values of temperature and wavelength and analytically or numerically calculating the vectors p and q using the simulated dependencies and the values measured, or according to an analytical alternative, determining exact or approximate analytical dependencies of the first and second power transfer function that depend on temperature and wavelength as well as on a respective n-dimensional parameter vector p and q, measuring values of the first and second electrical signal for one or more predetermined pairs of values of temperature and wavelength and determining the vectors p and q using the simulated dependencies and the values measured.

A more detailed explanation of analytical methods (if possible for the optical waveguide structure) or numerical methods that can be applied for solving the two non-linear equations defined by the two power transfer functions can be omitted in this description as a plurality of such appropriate methods are known to persons skilled in the field of developing optical sensor and transmission components.

In another embodiment of the invention, the absolute temperature value determined or the value of a temperature change of the optical waveguide structure determined is used for further processing, especially for controlling a heating and/or cooling device. Likewise, the absolute wavelength value determined or the value of a wavelength change of the optical probe signal determined is used for further processing, especially for controlling the wavelength of an optical transmitter creating the at least one probe signal. Of course, both alternatives can be applied simultaneously.

According to a further embodiment, the optical waveguide structure further defines a third optical output port, wherein the optical path between the optical input port and the third optical output port is configured in such a way that a constant power portion of the optical probe signal that is essentially independent of wavelength and temperature is output, as a third optical detection signal, at the third optical output port, that the third optical detection signal is detected by a third opto-electrical converter that creates a third electrical signal corresponding to the optical power of the third optical detection signal, that the third electrical signal is measured and that the values measured are used to normalize the measured values of the first and second electrical signal.

These values obtained by measuring the third optical detection signal can be used to normalize the values obtained by measuring the first and second optical detection signal. In this way, the values measured for the first and second optical detection signal can be made independent of variations of the power of the optical probe signal that is fed to the optical input port.

The optical detection device for detecting the absolute temperature or temperature changes and/or the absolute wavelength or wavelength changes of an optical probe signal according to the invention comprises, apart from the optical detection device, a first and a second opto-electrical converter which are configured to detect the first and second optical detection signal at the first and second optical output port and to create a respective first and second electrical signal corresponding to the optical power of the respective first or second optical detection signal. The optical converters may be realized using photodiodes and appropriate amplifiers, which may comprise electrical low-pass filters in order to reduce noise and high-frequency components, e.g. modulation components comprised by the optical probe signal, in case an information-carrying optical signal is used as optical probe signal. Further, the optical detection device comprises a control device which is configured to receive the first and second electrical signal and to obtain measured values of the first and second electrical signal and to determine an absolute temperature value or a value of a temperature change of the optical waveguide structure and/or an absolute wavelength value or a value of a wavelength change of the optical probe signal by using the values measured of the first and second electrical signal and a first and a second previously determined wavelength and temperature dependency of both the first and second power transfer function.

Of course, the control device may comprise appropriate hardware and software or firmware configured to perform an analog-to-digital conversion of the electrical signals and to carry out appropriate calculations and/or operations that are required for determining the desired temperature and/or wavelength values.

According to a preferred embodiment of the invention, the optical structure comprised by the optical detection device is configured in such a way that at least one optical resonator structure is provided within the optical paths between the optical input port and the first and second optical output port. As a resonator structure has a (usually periodical) power transfer function showing peaks at the resonance frequencies or wavelengths, respectively, such structures show a high sensitivity at least to wavelength changes, in many cases also to temperature changes. In this way, the accuracy of determining the wavelength and/or temperature values can be increased.

In one alternative, the optical structure may comprise an optical 1×2 power splitter that is configured to split an optical input path between the optical input port and a common port of the optical 1×2 power splitter into a first and a second optical splitting path between a first and a second optical splitting port of the optical 1×2 power splitter and the first and a second optical output port, wherein a first optical resonator is provided within the first optical splitting path and a second optical resonator is provided within the second optical splitting path. In order to fulfil the requirement of differing power transfer functions, the two resonators must reveal respective differing optical properties.

Especially, the first and second optical resonators can be realized by a respective optical waveguide structure, wherein the optical waveguide structure is configured to cause differing mode confinements of a first and a second partial optical probe signal guided within the first and second optical resonators. This leads to differing velocities of the partial optical probe signals (more strictly: to different group velocities respective pulsed optical signals or different phase velocities of respective cw optical signals) and to differing temperature dependencies of the power transfer functions defined by the partial optical probe signals.

According to differing embodiments of the invention, the first and second optical resonators may be realized by the same or different types of optical resonators.

The first and second optical resonators may have a differing core and cladding geometry, wherein identical materials are used for respective core and cladding regions, or an identical core and cladding geometry, wherein different materials are used for respective core and cladding regions.

According to a further embodiment, the optical structure comprises an optical 1×2 mode splitter that is configured to split an optical input path between the optical input port and a common port of the optical 1×2 mode splitter into a first and a second optical splitting path between a first and a second optical splitting port of the optical 1×2 mode splitter and the first and a second optical output port, wherein a single optical resonator is provided within the optical input path, wherein the optical input path is configured to guide, at least within the optical path portion between an input port of the optical resonator and the common port of the optical 1×2 mode splitter, a first and a second optical mode having differing propagation properties and wherein the optical 1×2 mode splitter is configured to direct the optical power portion of the optical signal fed to the common port of the optical 1×2 mode splitter that is comprised by the first optical mode to the first optical splitting path and the optical power portion that is comprised by the second optical mode to the second optical splitting path.

In such embodiments, the two differing power transfer functions are created by using two different modes that travel through the same resonator structure. In other words, the optical probe signal comprises two partial optical probe signals, wherein each of the partial optical probe signals propagates in the form of differing optical modes having differing group or phase velocities when propagating through the same optical structure. After having passed the single optical resonator, the partial optical probe signals are separated by the optical 1×2 mode splitter.

According to an embodiment, the optical input port of the optical waveguide structure may be configured in such a way that the first and second optical modes are excited in the optical input path as a response to feeding the optical probe signal to the optical input port.

Alternatively, the optical waveguide structure may comprise, within the optical input path between the optical input port and the optical resonator, an optical waveguide structure that is configured to create the first and second optical mode as a response to the optical probe signal. In this way, the creation of the optical modes is well defined. For example, a single optical mode may be excited within the optical input path portion upstream of the optical waveguide structure that is configured to create the two modes by coupling the optical probe signal to the input port, wherein the optical structure is configured to create the desired first and second optical mode within a downstream portion of the optical input path (and of course within the optical resonator and the optical path up to the common port of the optical mode splitter). In such embodiments, coupling the waveguide guiding the optical probe signal to the optical input port of the optical waveguide structure comprised by the optical detection device is less critical.

In embodiments that use two different optical modes, the first and second optical modes are ordinary modes of different orders, or orthogonally polarized modes of identical or differing order, or differing optical vortex beams with different optical angular momentum (OAM) or different spin angular momentum (SAM). It shall be noted that, within this description, the term "different optical modes" covers arbitrary types of forms of light waves that differ with respect to their group or phase velocity. For example, the same LP mode (of a weakly guiding waveguide) may comprise signal portions of differing polarizations that have different group or phase velocities. As already mentioned, also such differing propagation forms are referred to as "differing modes".

It shall also be mentioned that the terms "optical waveguide", "optical waveguide structure", "optical resonator", "optical resonator structure" are not restricted to embodiments that are realized in integrated optics technologies but also cover embodiments that are realized by discrete optical waveguides, for example optical fibers and other discrete optical components, such as optical fiber splitters etc.

BRIEF DESCRIPTION OF THE DRAWINGS

These and other features and objects of the present invention will become more fully apparent from the following description of specific embodiments thereof which are illustrated in the drawings. It is appreciated that these drawings depict only typical embodiments of the invention and are therefore not to be considered limiting of its scope. The invention will be described and explained with additional specificity and detail through the use of the accompanying drawings in which.

DESCRIPTION OF THE INVENTION

Figure 1:
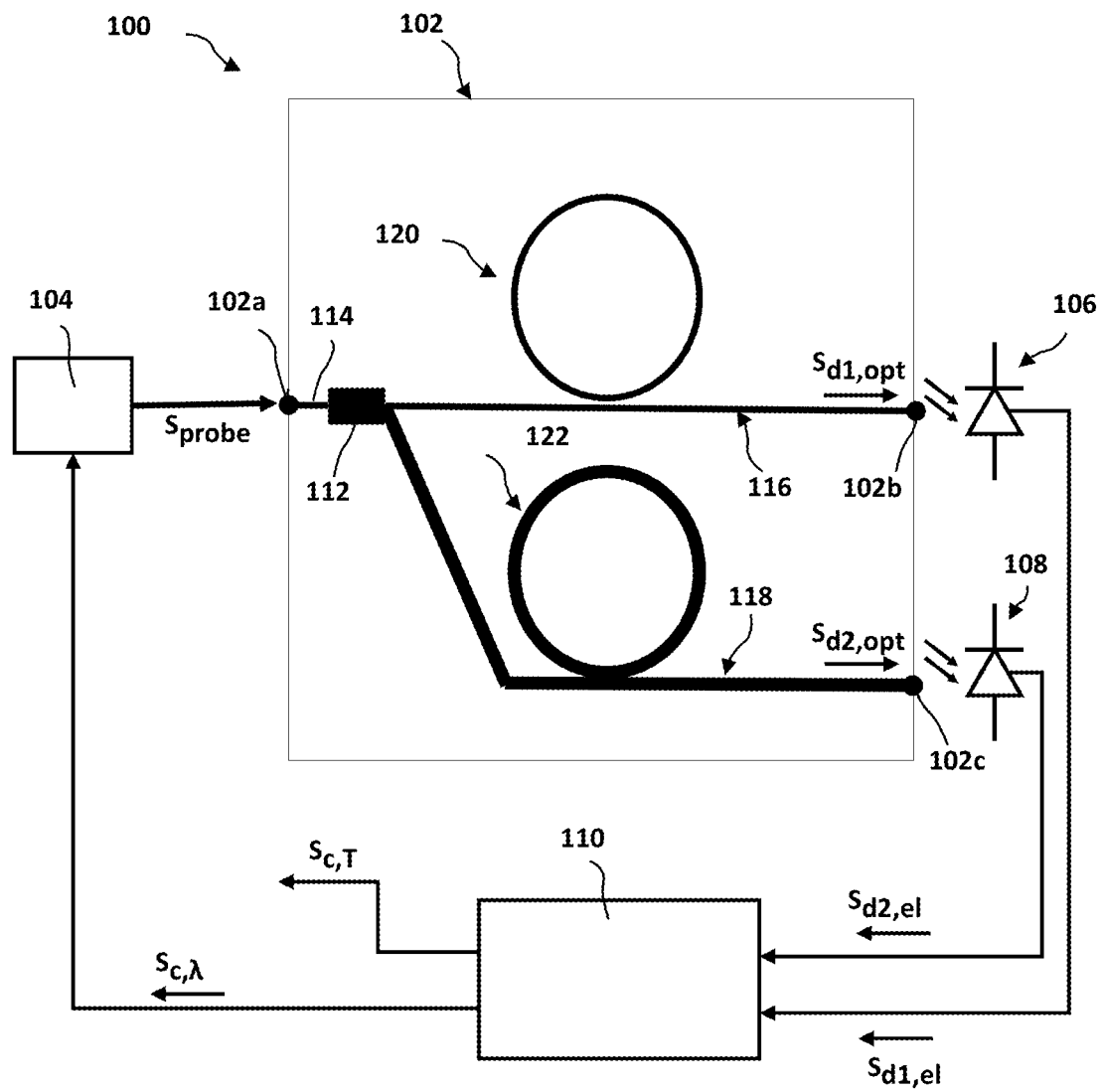
FIG. 1 shows a schematic block diagram of a first embodiment according to the invention of an optical detection device for detecting the absolute temperature or temperature changes and/or the absolute wavelength or wavelength changes of an optical probe signal, wherein the optical detection device comprises an optical waveguide structure including a first and a second optical ring resonator creating differing mode confinements for the partial optical probe signals.

FIG. 1 shows a first embodiment of an optical detection device 100 comprising an optical waveguide structure 102, an optical transmitter 104, a first and a second opto-electrical converter 106, 108, and a control device 110.

The optical transmitter 104 may comprise a laser that is configured to create an optical probe signal $S_{probe}$, which is fed to an input port 102a of the optical waveguide structure 102. The optical probe signal $S_{probe}$ may be a narrow band optical cw signal or an optical signal that is modulated in any arbitrary form. The modulation may be an amplitude modulation of the optical power, wherein the modulation may be used to implement a lock-in detection principle of the optical signals detected by the opto-electrical converters 106, 108. The optical probe signal may also be an information-carrying signal of an optical transmission system. In such an embodiment, the optical transmitter and the electro-optical converters may be part of the optical transmission system, e.g. part of an optical transmitter located at one end of an optical transmission link and part of an optical receiver located at the other end of the optical transmission link, respectively.

Each of the opto-electrical converters is configured to receive an optical detection signal $S_{d1,opt}$, $S_{d2,opt}$ at a respective first and second output port 102b, 102c of the optical waveguide structure 102 and to convert the respective optical signal into a corresponding electrical detection signal $S_{d1,el}$, $S_{d2,el}$. The electrical detection signals $S_{d1,el}$, $S_{d2,el}$ are fed to the control device 110. The control device 110 creates samples of the electrical detection signals and converts the samples into digital values of the electrical detection signals $S_{d1,el}$, $S_{d2,el}$. Of course, the opto-electrical converters 106, 108 can be realized in such a way that they deliver already digital values of the electrical detection signals to the control device 110.

Further, the control device 110 determines values of the absolute temperature or temperature changes of the optical waveguide structure (versus a reference value or any arbitrary previously determined value) and/or absolute values of the wavelength (i.e. the center wavelength) of the optical probe signal or wavelength changes thereof (versus a reference value or any arbitrary previously determined value). For this purpose, the control device carries out the method described below in at least one appropriate embodiment. The control device 110 may be configured to output a control signal $S_{c,T}$ that comprises the information concerning the absolute temperature or temperature change determined by carrying out the method and/or a control signal $S_{c,\lambda}$ that comprises the information concerning the absolute wavelength or wavelength change determined by carrying out the method. The control signal $S_{c,\lambda}$ is fed to the optical transmitter 104 in order to control the wavelength of the optical probe signal $S_{probe}$ in such a way that the wavelength thereof is kept at a predetermined value. The control signal $S_{c,T}$ may be fed to any appropriate device, e.g. a display device for displaying the current temperature or any other device, e.g. a heating and/or cooling device which is configured to keep the temperature at a predetermined value.

The control device 110 may be realized using hardware and specific software and/or firmware. Especially, the control device 110 may be realized using standardized hardware comprising a CPU and storage means, standardized signal input ports for receiving the electrical detection signals and outputting values for the temperature and wavelength or temperature changes or wavelength changes for further processing.

The optical waveguide structure 102 comprises an optical 1×2 power splitter 112 having a common port and a first and a second splitting port. The input port 102a of the optical waveguide structure 102 is connected to the common port by an optical waveguide 114 realizing an optical input path and the first and second splitting ports are connected to the first and second optical output port 102b, 102c of the optical waveguide structure 102 by a respective first and second optical splitting path 116, 118. A first and a second optical resonator 120, 122 is provided within the first and second splitting path. In the embodiment according to FIG. 1, the first and second optical resonators 120, 122 are realized as optical ring resonators, each of which comprises a coupling portion of the straight optical waveguide realizing the respective optical spitting path 116, 118 and a ring-shaped optical waveguide neighboring the coupling portion. The optical resonance properties of such optical ring resonators are well known.

In the embodiment shown in FIG. 1, the optical resonators have the same macro-structure, i.e. the optical axes of the resonator waveguides have the same geometry. As apparent from FIG. 1, both optical resonators are realized as ring resonators. The radius of the rings may be identical or different. However, the optical resonator waveguides have a differing micro-structure, i.e. the waveguides have a differing cross-sectional structure and/or the materials of the waveguides have differing optical properties. This leads to differing mode confinements of the partial optical probe signals fed to the optical resonators and, as a result, to differing group or phase velocities (at least to differing wavelength dependencies of the velocities) of the partial optical probe signals propagating in the first and second optical resonator. For simplicity, the whole optical paths including the optical resonators in the embodiment of FIG. 1 are illustrated in different line thicknesses, wherein the differing line thickness shall designate differing micro-structures and/or differing materials that are used for the core and/or cladding regions.

Figure 2A:
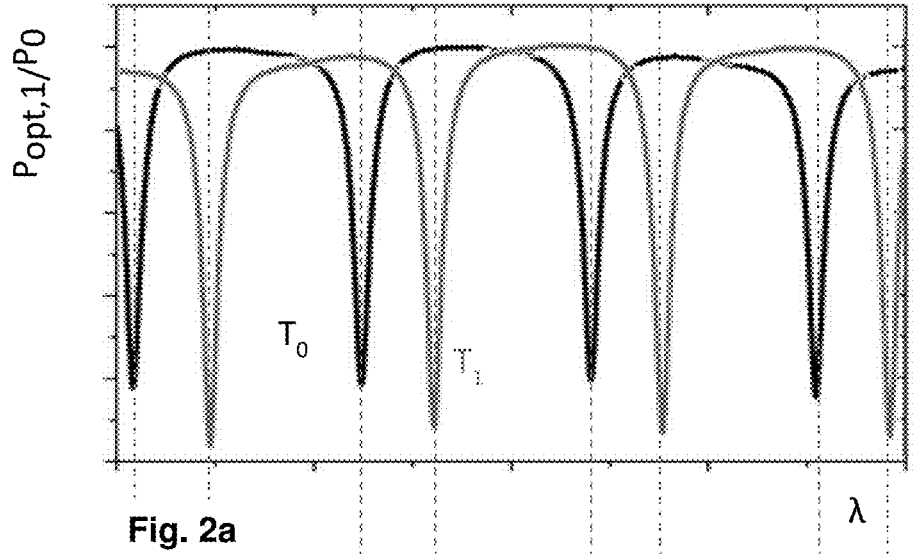
FIG. 2a shows a diagram illustrating the wavelength and temperature dependency of the first optical ring resonator of the optical detection device in FIG. 1.
Figure 2B:
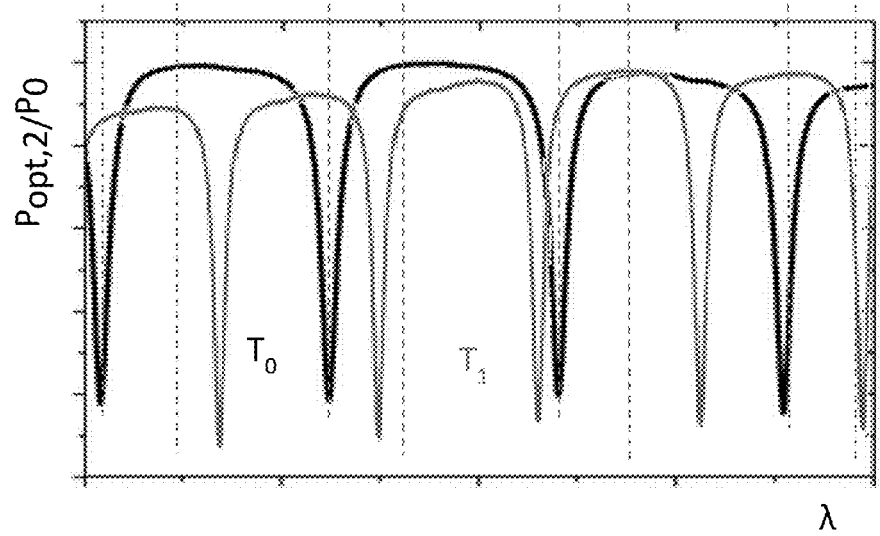
FIG. 2b shows a diagram illustrating the wavelength and temperature dependency of the second optical ring resonator of the optical detection device in FIG. 1.

FIGS. 2a and 2b show diagrams illustrating the wavelength dependency of the optical power of the optical detection signals $S_{d1,opt}$ and $S_{d2,opt}$ that are measured at the optical output ports 102b, 102c of the optical waveguide structure 102. As apparent from these Figures, the differing micro-structures lead to a different temperature dependency of the optical detection signals $S_{d1,opt}$ and $S_{d2,opt}$. In this embodiment, the micro-structures have been designed in such a way that at a given first temperature $T_0$ (e.g. 20° C.) the optical power $P_{opt,1}$ of the optical detection signal $S_{d1,opt}$ has the same course as the optical power $P_{opt,2}$ of the optical detection signal $S_{d2,opt}$. This is, however, not necessary. At a further temperature $T_1$, the curves for the optical power $P_{opt,1}$ and $P_{opt,2}$ reveal a differing wavelength dependency.

Thus, in general, the optical waveguide structure 102 defines an optical 3-port, the optical transmission properties of which are defined by a first power transfer function $F_1$ that characterizes the optical transmission properties between the optical input port 102a and the first optical output port 102b and a second power transfer function $F_2$ that characterizes the optical transmission properties between the optical input port 102a and the second optical output port 102c. Thus, as the first and second optical transfer functions $F_1$, $F_2$ depend on the variables temperature T and wavelength $\lambda$, they can be written as $$F_1(\lambda, T) = \frac{P_{opt,1}(\lambda, T)}{P_0} \qquad (1)$$

$$F_2(\lambda, T) = \frac{P_{opt,2}(\lambda, T)}{P_0} \qquad (2)$$

wherein $P_{opt,1}(\lambda,T)$, $P_{opt,2}(\lambda,T)$ is the optical power of the optical detection signal $S_{d1,opt}$ and $S_{d2,opt}$, respectively, and $P_0$ is the optical power of the optical probe signal $S_{probe}$ that is fed to the optical input port, which is equal to the optical signal guided in the optical waveguide 114. If the partial power transfer functions of the first and second optical resonators 120, 122 are designated as $F_{R1}(\lambda,T)$, $F_{R2}(\lambda,T)$, the above equations may be rewritten as $$F_1(\lambda, T) = \frac{P_{opt,1}(\lambda, T)}{P_0} = k \cdot F_{R1}(\lambda, T) \qquad (3)$$

$$F_2(\lambda, T) = \frac{P_{opt,2}(\lambda, T)}{P_0} = (1-k) \cdot F_{R2}(\lambda, T) \qquad (4)$$

wherein k designates the splitting ratio (e.g. 1:1) of the optical 1×2 power splitter 112. As apparent from FIGS. 2a and 2b, the curves represent the power transfer functions, wherein the splitting ratio k is equal to 1, i.e. a 50% portion of the optical input power $P_0$ is output at each splitting port (the splitter is deemed to be lossless for simplicity).

That is, if the full dependencies $F_1(\lambda,T)$, $F_2(\lambda,T)$ are known, it is possible to determine the wavelength and temperature values from values of $F_1$ and $F_2$, respectively, which can be obtained by measuring values for $P_{opt,1}(\lambda,T)$ and $P_{opt,2}(\lambda,T)$. The value for $P_0$ can e.g. be obtained by measuring the output power of the optical probe signal $S_{probe}$ created by the optical transmitter 104, e.g. measuring the optical power output at a fiber pigtail that is coupled to the input port before coupling the pigtail to the optical input port 102a. The coupling efficiency of the optical connection between the pigtail and the splitting ratio of the 1×2 power splitter can be estimated on the basis of a maximum coupling efficiency possible (e.g. based on differing mode confinements of the optical signals propagating in the pigtail and the optical waveguide 114).

Figure 4:
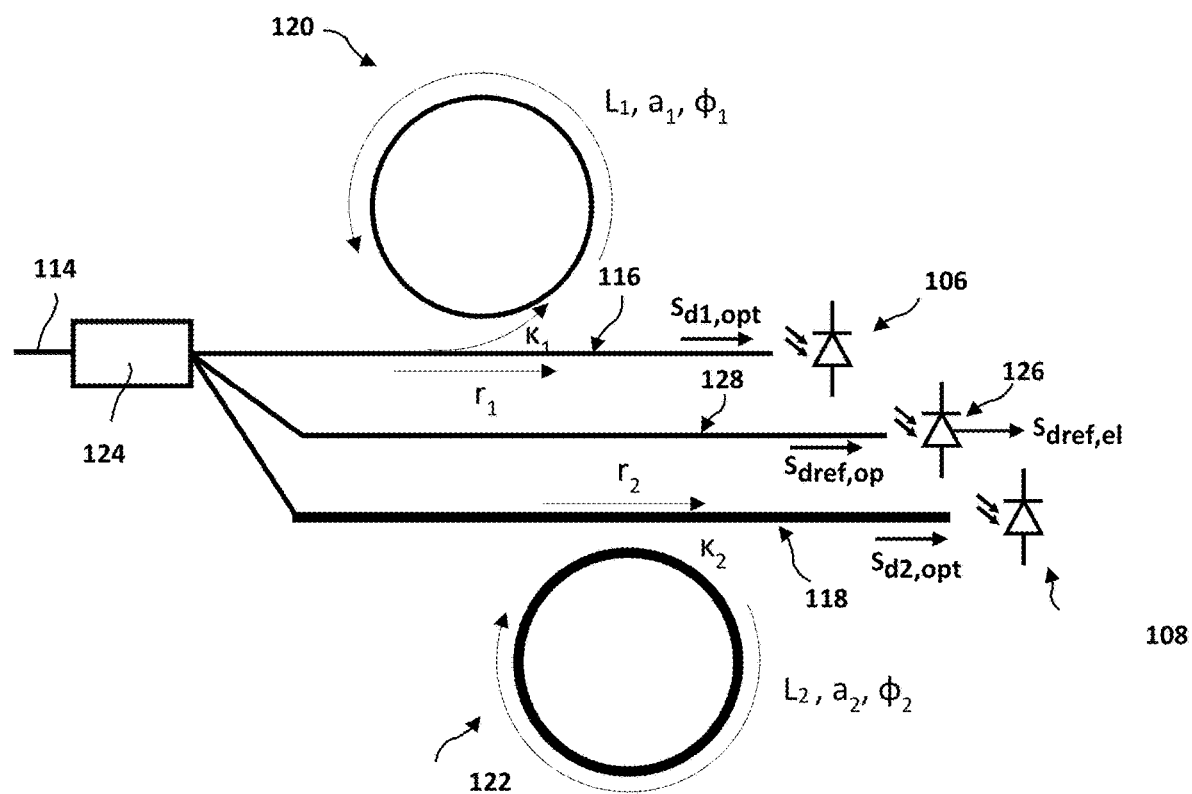
FIG. 4 shows a schematic block diagram of a third embodiment of an optical detection device similar to the first embodiment according to FIG. 1, wherein an additional power reference path is provided.

However, it is also possible to provide a reference path within the optical waveguide structure 102 as shown in the embodiment according to FIG. 4. Here, an optical 1×3 splitter 124 is used instead of an optical 1×2 splitter, wherein the additional optical path, which essentially reveals no temperature and wavelength dependency and which is essentially lossless (or has a known constant loss), is used in order to obtain a measurement value that is proportional to the input power of the optical probe signal $S_{opt}$ fed to the optical input port. The exact splitting ratio of the 1×3 splitter 124 can e.g. be determined by measuring the output power values at each of the output ports of a corresponding reference splitter that has been manufactured using the same process (and process parameters), wherein, of course, no resonators are provided within the reference structure. As the processes for manufacturing splitters (e.g. in integrated optics technologies) can be carried out with sufficiently constant results, measuring the splitting ratio of such a reference power splitter yields sufficiently exact values for the power splitter to be assessed.

This method (and device) can of course also be used in connection with all other embodiments described below.

The method discussed above is a brute force method that requires exorbitant measurement effort as both power transfer functions must be measured for a high number of temperatures in addition to measuring the reference power value $P_0$ and the splitting ratio.

Of course, as already mentioned, the two power transfer functions must be configured in such a way that they define a bijective mapping between the parameters wavelength and temperature and the corresponding values of the power transfer functions at least within a predefined range for the temperature and the wavelength. Taking into account the periodical behavior of the transfer functions $F_1(\lambda,T)$, $F_2(\lambda,T)$ due to the resonators 120, 122, the initial setting of a first value pair $(\lambda,T)$ must lie within the corresponding predefined range in which the bijective property is guaranteed. This is a general requirement that must be fulfilled by the optical wavelength structure 102.

Instead of such a brute force method, it is possible to perform n-dimensional simulations to determine the power transfer functions $F_1(\lambda,T,p)$, $F_2(\lambda,T,q)$, wherein p and q are n-dimensional vectors comprising elements $p_1$ to $p_n$ and $q_1$ to $q_n$, respectively. The vectors p and q can then be determined by performing a calibration process, e.g. measuring the wavelength dependencies of $F_1$ and $F_2$ (for a sufficient number of values for the wavelength) at two or more temperatures $T_0, T_1, \ldots, T_m$, and calculating the values for $p_1$ to $p_n$, and $q_1$ to $q_n$. The calculations of the values of the wavelength and temperature or wavelength change and temperature change (i.e. effecting the inversion of the relations $F_1(\lambda,T)$, $F_2(\lambda,T)$) can then be carried out using appropriate numerical methods.

The simplest method to determine the power transfer functions $F_1(\lambda,T)$, $F_2(\lambda,T)$, if possible, depending on the complexity of the optical waveguide structure, e.g. the type of resonators used, is to determine analytical expressions for the power functions $F_1(\lambda,T,p)$, $F_2(\lambda,T,q)$ and to determine the elements of the vectors p and q by a calibration process, e.g. by measuring the wavelength dependencies of $F_1$ and $F_2$ (for a sufficient number of values for the wavelength) at two or more temperatures $T_0, T_1, \ldots, T_m$, and (if possible, analytically) calculating the values for $p_1$ to $p_n$, and $q_1$ to $q_n$.

The latter method shall briefly be explained with respect to the embodiment shown in FIG. 4 that uses, as does the embodiment shown in FIG. 1, two optical resonators having the same macro-structure but different micro-structures.

The two power transfer functions $F_{R1}(\lambda,T)$, $F_{R2}(\lambda,T)$ as defined by equations (3) and (4) for the ring resonators 120, 122 can be analytically described by the following equations $$F_{R1}(\lambda, T) = \frac{P_{opt1}(\lambda, T)}{P_{01}} = \frac{a_1^2 - 2a_1 r_1 \cos(\varphi_1) + r_1^2}{1 - 2a_1 r_1 \cos(\varphi_1) + (a_1 r_1)^2} \qquad (5)$$

$$\varphi_1 = \beta_1 \cdot L_1 = \frac{2\pi}{\lambda} \cdot n_{\mathit{eff},1}(T, \lambda) \cdot L_1 \qquad (6)$$

-continued $$F_{R2}(\lambda, T) = \frac{P_{opt2}(\lambda, T)}{P_{02}} = \frac{a_2^2 - 2a_2 r_2 \cos(\varphi_2) + r_2^2}{1 - 2a_2 r_2 \cos(\varphi_2) + (a_2 r_2)^2} \quad (7)$$

$$\varphi_2 = \beta_2 \cdot L_2 = \frac{2\pi}{\lambda} \cdot n_{eff,2}(T, \lambda) \cdot L_2 \quad (8)$$

wherein in these equations the following entities are used:
$P_{opt,1}(\lambda,T)$ the optical power of the first optical detection signal ($S_{d1,opt}$);
$P_{opt,2}(\lambda,T)$ the optical power of the first optical detection signal ($S_{d2,opt}$);
$P_{01}$, $P_{02}$ the optical power of the partial optical probe signals fed to the first and second optical resonator 120, 122;
$a_1$, $a_2$ the attenuation coefficients of the ring waveguides of the first and second optical resonator 120, 122;
$r_1$, $r_2$ the transmission coefficients of the first and second optical resonator 120, 122;
$K_1$, $K_2$ the coupling coefficients between the ring waveguides and the straight waveguides of the first and second optical resonator 120, 122;
$n_{eff,1}$, $n_{eff,2}$ the effective refractive index of the waveguides of the first and second optical resonator 120, 122; and
$L_1$, $L_2$ the lengths of the ring waveguides of the first and second optical resonator 120, 122;

The power transfer functions $F_1(\lambda,T)$, $F_2(\lambda,T)$ describing the characteristics of the optical waveguide structure 102 between the optical input port 102a and the optical output ports can be written as $$F_1(\lambda, T) = k_1 \cdot F_{R1}(\lambda, T) = \frac{P_{opt,1}(\lambda, T)}{P_{opt,ref}(\lambda, T)} \cdot k_{ref} \quad (9)$$

$$F_2(\lambda, T) = k_2 \cdot F_{R2}(\lambda, T) = \frac{P_{opt,2}(\lambda, T)}{P_{opt,ref}(\lambda, T)} \cdot k_{ref} \quad (10)$$

wherein $P_{opt,ref}(\lambda,T)$ is the optical power of a third or reference optical detection signal $S_{dref,opt}$ detected by the opto-electrical converter 126 at the output port of the optical reference path (at given values for T and $\lambda$), $k_1$, $k_2$ is the splitting ratio of the optical 1×3 power splitter 124 with respect to the first and second optical splitting path comprising the first and second optical resonator, respectively, and $k_{ref}$ is the splitting ratio of the optical 1×3 power splitter 124 with respect to the optical reference path 128. Of course, the opto-electrical converter 126 creates a third or reference electrical signal $S_{dref,el}$ that is supplied to the control device 110 for further processing and evaluation.

Using a linearization for $n_{eff}(\lambda,T)$ in an operating point $(\lambda_0, T_0)$ (e.g. defined by a temperature value $T_0$ and a center wavelength $\lambda_0$ in a respective middle of an operating range for the temperature T and the wavelength $\lambda$), the following approximation can be applied:

$$n_{eff}(\lambda, T) = n_{eff}(\lambda_0, T_0) + \Delta T \frac{\partial n_{eff}}{\partial T} + \Delta \lambda \frac{\partial n_{eff}}{\partial \lambda} \quad (11)$$

wherein the values of $n_{eff}(\lambda_0, T_0)$ and $$\frac{\partial n_{eff}}{\partial T}, \frac{\partial n_{eff}}{\partial \lambda}$$

can be obtained from simulations of the waveguides taking into account the properties of the materials used for the core and cladding regions. It can be shown that, in a good approximation, constant values can be used for $$\frac{\partial n_{eff}}{\partial T}, \frac{\partial n_{eff}}{\partial \lambda}$$

within a sufficiently broad usually interesting range for the temperature and wavelength.

Using this linearization, equations (6) and (8) can be written as $$\varphi_1 = \beta_1 \cdot L_1 = \frac{2\pi}{\lambda} \cdot n_{eff,1}(T, \lambda) \cdot L_1 = \quad (12)$$
$$\frac{2\pi}{\lambda} \cdot L_1 \cdot \left( n_{eff,1}(\lambda_0, T_0) + \Delta T \frac{\partial n_{eff,1}}{\partial T} + \Delta \lambda \frac{\partial n_{eff,1}}{\partial \lambda} \right)$$

$$\varphi_2 = \beta_2 \cdot L_2 = \frac{2\pi}{\lambda} \cdot n_{eff,2}(T, \lambda) \cdot L_2 = \quad (13)$$
$$\frac{2\pi}{\lambda} \cdot L_2 \cdot \left( n_{eff,2}(\lambda_0, T_0) + \Delta T \frac{\partial n_{eff,2}}{\partial T} + \Delta \lambda \frac{\partial n_{eff,2}}{\partial \lambda} \right)$$

Solving equations (5) and (7) for $\cos(\varphi_1)$ yields $$\cos(\varphi_1) = \frac{a_1^2 + r_1^2 - F_{R1}(\lambda, T) - F_{R1}(\lambda, T)(a_1 r_1)^2}{2 a_1 r_1 (1 - T_1)} \quad (14)$$

$$\cos(\varphi_2) = \frac{a_2^2 + r_2^2 - F_{R2}(\lambda, T) - F_{R2}(\lambda, T)(a_2 r_2)^2}{2 a_2 r_2 (1 - T_2)} \quad (15)$$

Inserting equations (12) and (13) into equations (14) and (15) yields $$\cos\left( \frac{2\pi}{\lambda} \cdot L_1 \cdot \left( n_{eff,1}(\lambda_0, T_0) + \Delta T \frac{\partial n_{eff,1}}{\partial T} + \Delta \lambda \frac{\partial n_{eff,1}}{\partial \lambda} \right) \right) = \quad (16)$$
$$\frac{a_1^2 + r_1^2 - F_{R1}(\lambda, T) - F_{R1}(\lambda, T)(a_1 r_1)^2}{2 a_1 r_1 (1 - T_1)}$$

$$\cos\left( \frac{2\pi}{\lambda} \cdot L_2 \cdot \left( n_{eff,2}(\lambda_0, T_0) + \Delta T \frac{\partial n_{eff,2}}{\partial T} + \Delta \lambda \frac{\partial n_{eff,2}}{\partial \lambda} \right) \right) = \quad (17)$$
$$\frac{a_2^2 + r_2^2 - F_{R2}(\lambda, T) - F_{R2}(\lambda, T)(a_2 r_2)^2}{2 a_2 r_2 (1 - T_2)}$$

wherein the values $F_{R1}(\lambda,T)$, $F_{R2}(\lambda,T)$ of the partial transfer functions can be replaced by the measured values $P_{opt1}(\lambda,T)$, $P_{opt2}(\lambda, T)$ and $P_{opt,ref}(\lambda, T)$ (strictly spoken, by the respective values of the opto-electrically converted signals) using equations (9) and (10)

$$F_{R1}(\lambda, T) = \frac{P_{opt1}(\lambda T)}{P_{opt,ref}(\lambda T)} \cdot \frac{k_{ref}}{k_1} \quad (18)$$

$$F_{R2}(\lambda, T) = \frac{P_{opt2}(\lambda T)}{P_{opt,ref}(\lambda T)} \cdot \frac{k_{ref}}{k_1} \quad (19)$$

Assuming that an initial blind tuning reveals an accuracy better than one half-period, equations (16), (17) can be rewritten as a system of two linear equations for the two unknown entities $\Delta T$ and $\Delta \lambda$:

$$\frac{2\pi}{\lambda} \cdot L_1 \cdot \left(n_{\mathit{eff},1}(\lambda_0, T_0) + \Delta T \frac{\partial n_{\mathit{eff},1}}{\partial T} + \Delta \lambda \frac{\partial n_{\mathit{eff},1}}{\partial \lambda}\right) = \quad (20)$$
$$\cos^{-1}\left(\frac{a_1^2 + r_1^2 - F_{R1}(\lambda, T) - F_{R1}(\lambda, T)(a_1 r_1)^2}{2 a_1 r_1 (1 - T_1)}\right)$$

$$\frac{2\pi}{\lambda} \cdot L_2 \cdot \left(n_{\mathit{eff},2}(\lambda_0, T_0) + \Delta T \frac{\partial n_{\mathit{eff},2}}{\partial T} + \Delta \lambda \frac{\partial n_{\mathit{eff},2}}{\partial \lambda}\right) = \quad (21)$$
$$\cos^{-1}\left(\frac{a_2^2 + r_2^2 - F_{R2}(\lambda, T) - F_{R2}(\lambda, T)(a_2 r_2)^2}{2 a_2 r_2 (1 - T_2)}\right)$$

This equation system can be easily solved analytically for the desired values $\Delta T$ and $\Delta \lambda$, wherein the values of the partial transfer functions can be replaced using equations (18), (19). The wavelength value $\lambda$ is a value that is determined in the previous step or, if the previous step is the first step, an initial setting for the wavelength.

The values for the parameters $a_1$, $a_2$, $r_1$, $r_2$ describing the optical resonators 120, 122 can be obtained by performing an appropriate simulation or, with higher accuracy as manufacturing tolerances can be taken into account, by performing a calibration process for each type or manufactured charge of optical waveguide structures 102 or for each single optical waveguide structure 102. In such a calibration process, the temperature T is kept constant at a known value $T_0$, e.g. the room temperature, whereas the wavelength is varied from a minimum to a maximum value (preferably within the interesting range in which measurement shall be performed using the calibrated device). In this way, the power transfer function for each optical resonator 120, 122 is obtained for a fixed temperature value $T_0$ as shown in FIGS. 2a and 2b. From these curves or measured values, respectively, the free spectral range $FSR_1$, $FSR_2$ for each of the optical ring resonators can be determined by determining the maxima or minima of the respective curve and determining the wavelength difference between the maxima or minima, respectively.

The values of $\varphi_1$ and $\varphi_{2'}$ in equations (5) and (7) can be extracted from $$FSR_1 = \frac{\lambda^2}{n_{g1} L_1} \quad (22)$$

$$FSR_2 = \frac{\lambda^2}{n_{g2} L_2} \quad (22)$$

using the relationships between the group refractive index $n_{g1}$, $n_{g1}$ and the effective refractive index $n_{\mathit{eff}1}$, $n_{\mathit{eff}2}$ $$n_{g1}(\lambda) = n_{\mathit{eff}1}(\lambda) - \lambda \frac{dn_{\mathit{eff}1}(\lambda)}{d\lambda} \quad (23)$$

$$n_{g1}(\lambda) = n_{\mathit{eff}1}(\lambda) - \lambda \frac{dn_{\mathit{eff}1}(\lambda)}{d\lambda} \quad (23)$$

and the conditions for constructive interference $n_{\mathit{eff}1} \cdot L_1 = m \cdot \lambda$, $n_{\mathit{eff}2} \cdot L_2 = m \cdot \lambda$, wherein m is an (integer) index designating the order of the period of the periodical power transfer function $F_{R1}$, $F_{R2}$.

It can be shown that using the linearizations $$n_{\mathit{eff}1}(\lambda) = n_{\mathit{eff}1}(\lambda_0) - (\lambda_0 - \lambda) \frac{dn_{\mathit{eff}}}{d\lambda} \quad (24)$$

$$n_{\mathit{eff}2}(\lambda) = n_{\mathit{eff}2}(\lambda_0) - (\lambda_0 - \lambda) \frac{dn_{\mathit{eff}}}{d\lambda} \quad (25)$$

equations (5) and (7) have extrema for $$\lambda = \frac{n_{\mathit{eff}1}(\lambda_0) - \lambda_0 \frac{dn_{\mathit{eff}1}}{d\lambda}}{\frac{m}{2L_1} - \frac{dn_{\mathit{eff}1}}{d\lambda}} \quad (25)$$

$$\lambda = \frac{n_{\mathit{eff}2}(\lambda_0) - \lambda_0 \frac{dn_{\mathit{eff}2}}{d\lambda}}{\frac{m}{2L_2} - \frac{dn_{\mathit{eff}2}}{d\lambda}} \quad (25)$$

wherein the power transfer functions have maxima for even m and minima for odd m.

Using the substitutions $x_1 = a_1^2 + r_1^2$; $y_1 = a_1 \cdot r_1$ and $x_2 = a_2^2 + r_2^2$; $y_2 = a_2 \cdot r_2$ the following solutions for $x_i$ and $y_i$ ($i=1; 2$) can be obtained for $x_i$ and $y_i$ ($i=1; 2$):

$$x_i = \frac{2(2 P_{opt,i,min} P_{opt,i,max} + P_{opt,i,min} - P_{opt,i,max})}{\left(\sqrt{P_{opt,i,min}} - \sqrt{P_{opt,i,max}}\right)^2} \quad (26)$$

$$y_i = \frac{\sqrt{P_{opt,i,min}} + \sqrt{P_{opt,i,max}}}{\sqrt{P_{opt,i,max}} - \sqrt{P_{opt,i,min}}} \quad (27)$$

That is the values for $x_i$ and $y_i$ (or $a_i$ and $r_i$) can be determined from measured values $P_{opt,i,min}$ and $P_{opt,i,max}$ at the respective temperature $T_0$, wherein $P_{opt,i,max}$ and $P_{opt,i,min}$ designate the maximum and minimum values of the optical power measured at the first and second output port, respectively.

After having performed this calibration and, as the case may be measuring the splitting matrix of the optical splitter (e.g. using a test structure), the method of determining the wavelength and temperature can be carried out by measuring the optical power at the first and second output port and at the reference port.

As apparent from the above explanation, this specific embodiment of the method according to the invention creates values for a wavelength change and/or a temperature change as compared to a respective value that has been determined in a preceding step.

Figure 7:
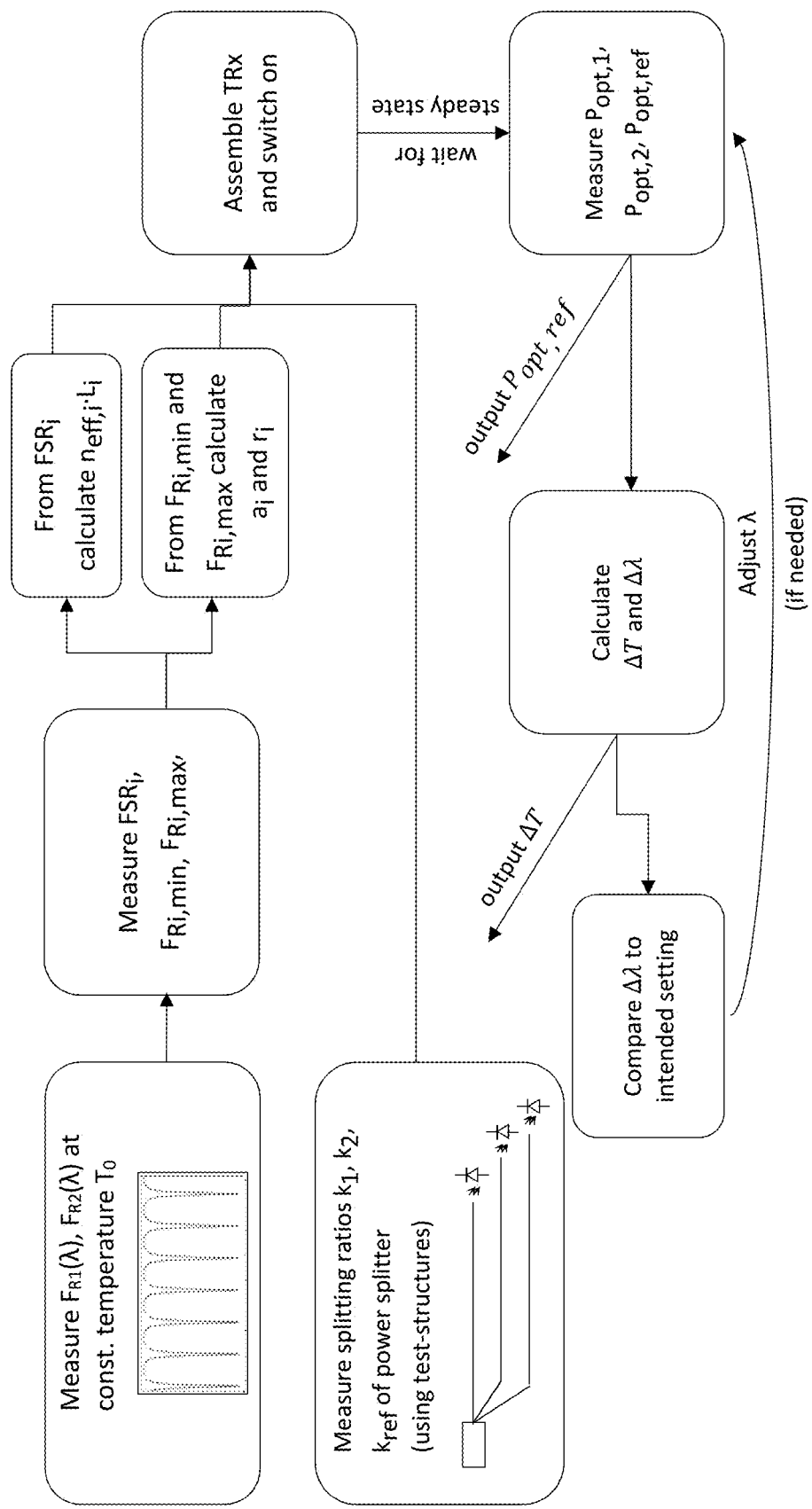
FIG. 7 shows a general flow diagram of the method according to the invention for detecting the absolute temperature or temperature changes and/or the absolute wavelength or wavelength changes of an optical probe signal using an optical detection device.

FIG. 7 shows a flow diagram illustrating the method for carrying out the specific mostly analytical method explained above. In an initial step, calibration is carried out. The calibration process comprises, in a first step, measuring, at a given temperature value $T_0$, for example at a temperature of 300 K, the transfer functions $F_{R1}(\lambda)$, $F_{R2}(\lambda)$ (of course by measuring the respective values $P_{opt,1}$, $P_{opt,2}$ and $P_{opt,ref}$) that characterize the 3-port defined by the optical waveguide structure 102 (the index "i" used for several entities in FIG. 7 is either 1 or 2). From these values, the free spectral range values $FSR_1$ and $FSR_2$ as well as the values of the minima and maxima $F_{R1,min}$, $F_{R2,min}$, $F_{R1,max}$, $F_{R2,max}$ can be determined. The values for $FSR_1$ and $FSR_2$ can then be used to calculate $n_{\mathit{eff},1} \cdot L_1$ and $n_{\mathit{eff},1} \cdot L_1$. The values for the parameters $a_1$, $a_2$, $r_1$, $r_2$ can be calculated from $F_{R1,min}$, $F_{R2,min}$, $F_{R1,max}$, $F_{R2,max}$. The splitting ratios $k_1$, $k_2$ and $k_{ref}$ of the power splitter can be determined using a test structure that has been manufactured using the same technology and the same manufacturing means and process parameters.

After this calibration step, the optical detection device can be assembled and switched on. After a steady state has been achieved, cycles for determining values for ΔT and Δλ can be started. Each cycle comprises, in a first step, measuring the optical powers $P_{opt,1}$, $P_{opt,2}$ and $P_{opt,ref}$ using the opto-electrical converters 106, 108 and 126. The value Δλ can be used to control the wavelength of the optical transmitter 104. As already mentioned, the value ΔT can also be used for further processing or controlling a heating and/or cooling device or merely be reported or displayed. Of course, if the temperature is the decisive parameter, the value ΔT can be used for control purposes and the value Δλ can just be reported or displayed.

Figure 3:
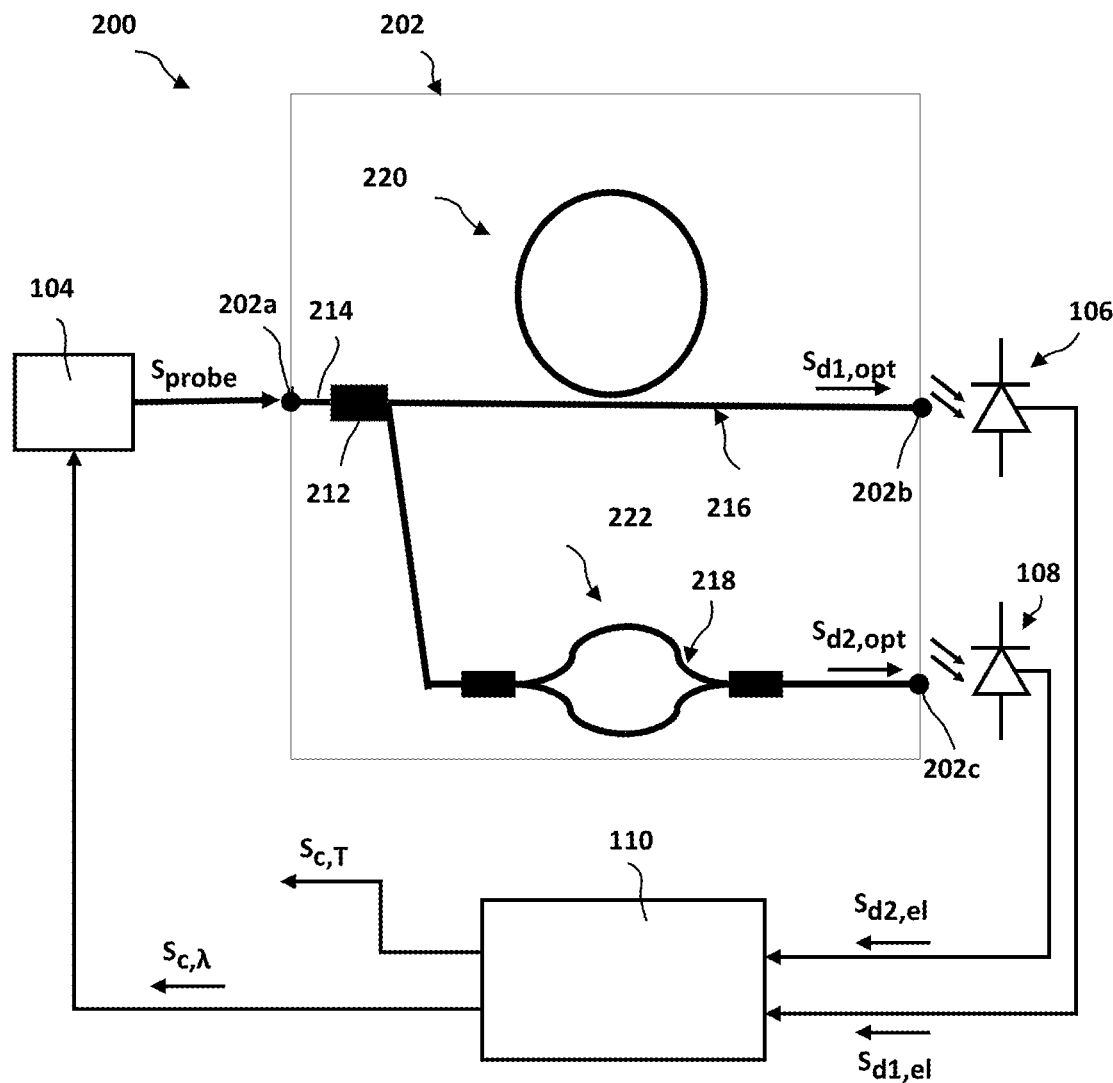
FIG. 3 shows a schematic block diagram of a second embodiment of an optical detection device, wherein the optical detection device comprises an optical waveguide structure including a first and a second optical ring resonator having differing macro-structures.

The embodiment shown in FIG. 3 shows an optical detection device 200 that differs from the embodiment shown in FIGS. 1 and 4 only in that a corresponding waveguide structure 202 of the optical detection device 200 comprises an optical ring resonator as a first optical resonator 220 and a two-arm Mach-Zehnder interferometer as a second optical resonator 222. The optical resonators 220, 222 or, preferably, the whole optical splitting paths comprising the optical resonators 220, 222, are realized by optical waveguides that create a differing mode confinement for the optical signals guided in these optical paths. For simplicity, identical components and features of the optical detection devices 100 and 200 are designated using identical reference signs. Reference signs designating corresponding features and components of the optical waveguide structure 202 are designated by corresponding reference numbers, wherein the reference numbers of the corresponding components and features of the optical waveguide structure 100 have been increased by a value of 100.

The method described above for the optical detection device 100 and the optical waveguide structure 102, respectively, may be carried out analogously for the optical detection device 200 and the optical waveguide structure 202. Of course, the brute-force method or the method fully simulating the optical waveguide structure 202, as the case may be, in connection with a calibration process may also be applied in connection with this embodiment.

Figure 5:
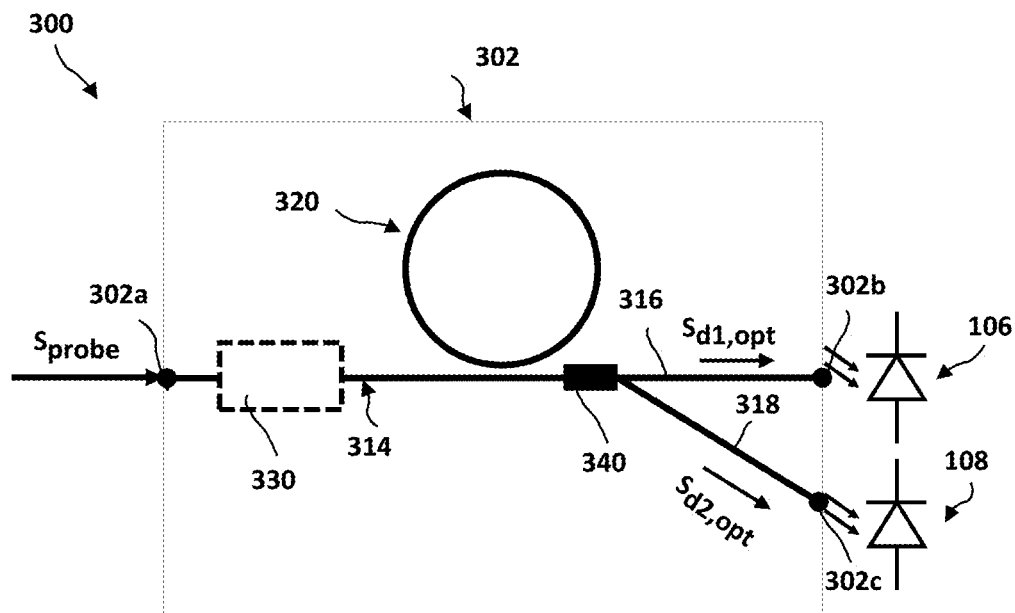
FIG. 5 shows a schematic block diagram of a fourth embodiment of an optical detection device, wherein the optical detection device comprises an optical waveguide structure including a single optical ring resonator and an optical mode splitter.

FIG. 5 shows a further embodiment of an optical detection device 300 comprising an optical waveguide structure 302, wherein an optical waveguide structure 302 comprises a single optical resonator 320 only. Other components external to the optical waveguide structure 302 are identical with the components shown in FIGS. 1 and 3, wherein, of these external components, only the opto-electrical converters 106 and 108 are shown.

The optical probe signal $S_{probe}$ that is supplied to optical input port 302a either already comprises two different modes, or two different modes are created by coupling the optical probe signal $S_{probe}$ to the input port 302a. According to a further alternative, two different modes may be created by an additional optical component or optical waveguide structure 330 that is provided within the optical path 314 between the input port 302a and the optical resonator 320. The optical resonator 320 is capable of guiding both of the optical modes supplied to it. As the waveguides or waveguide structure realizing the optical resonator 320 define(s) a different mode confinement for each of the two modes, the modes have differing group or phase velocities. Therefore, the optical resonator 320 creates different wavelength and temperature dependencies for each of the partial signals defined by the two modes. After the still combined optical modes leave the optical resonator 320, the respective partial optical signals are split into a first and second optical splitting path 316 and 318, respectively. This splitting is effected by providing an optical 1×2 mode splitter 340 in the optical path after the optical resonator 320. The partial optical signals (which may also be referred to as the optical detection signals $S_{d1,opt}$, $S_{d2,opt}$) are fed to a respective first and second optical output port 302b and 302c, respectively.

Figures 6A, 6B:
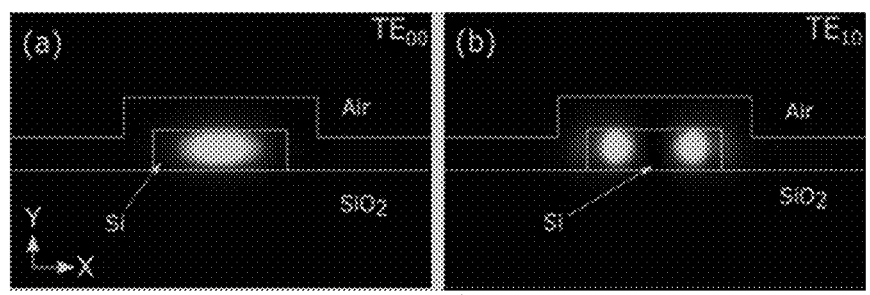
FIG. 6a is a schematic illustration of the intensity distribution of a first optical mode in the form of a $TE_{00}$ mode in one of the splitting paths of the optical waveguide structure in FIG. 5.
FIG. 6b is a schematic illustration of the intensity distribution of a first optical mode in the form of a $TE_{10}$ mode in one of the splitting paths of the optical waveguide structure in FIG. 5.

FIG. 6a and FIG. 6b show examples of the two different modes that may be present within the optical resonator 320, wherein FIG. 6a shows a cross-sectional intensity distribution of a $TE_N$, mode and FIG. 6b shows a cross-sectional intensity distribution of a $TE_{10}$ mode that are guided in an integrated waveguide having a rectangular-shaped core (the integrated optical waveguide being manufactured using silicon on silica technology).

The optical component or optical waveguide structure 330 that might be used for creating the two optical modes may, in a rather simple form, be a connection of an optical input waveguide portion of the optical path 314 that is merely capable of guiding a single mode to a further waveguide portion of the optical path 314 that is capable of guiding the desired two different optical modes (at the given wavelength).

It shall again be mentioned that any types of two modes can be used including two orthogonally polarized modes (of the same type) and two differing optical vortex beams with different optical angular momentum (OAM) or different spin angular momentum (SAM). For realizing an embodiment according to the latter type, an appropriate optical component or waveguide structure 330 may be used. As such components are known in the art, a more detailed description can be omitted. Of course, the optical mode splitter 340 must be adapted to the two differing modes used in the embodiment. At any rate, the optical mode splitter 340 must be capable of splitting the two optical modes into the respective optical splitting paths 316, 318.

In the embodiment according to FIG. 5, an optical reference path for measuring an optical power $P_{opt,ref}$ may of course also be used. For this purpose, an optical power splitter may be provided within the input ports 314 (as the case may be, before the optical component 330) so that part of the optical power of the optical probe signal $S_{probe}$ may be supplied to a respective optical output port.

The general method for measuring the optical signals is the same for all of the types of optical waveguide structures 102, 202 and 302 described above. Of course, it might be necessary to adapt a simulation method and an analytical calculation method to the specific embodiment.

It shall be mentioned that the temperature- and wavelength-sensitive optical waveguide structures 102, 202 and 302 can be realized in any appropriate manner. Especially, the whole waveguide structure 102, 202 and 302 may be realized as a PIC, i.e. the optical waveguides are provided on a substrate using any integrated optics technology, e.g. silica on silicon technology or silicon on insulator (SOI) technology, where a silicon waveguide is suspended in a silica cladding. However, the optical waveguide structure may also be realized using discrete optical components, e.g. optical fibers having differing micro-structures and discrete optical power or mode splitters.

In general, the invention is based on the finding that the two power transfer functions can be achieved by using partial optical probe signals that have different group or phase velocities due to a different mode confinement. Assuming any material system for optical integration, the waveguide (core) is suspended in one (or more) cladding material(s), which is (are) different from the core material.

By increasing (decreasing) the confinement of a waveguide mode in the core—e.g. by changing the waveguide's geometry—one can decrease (increase) the fraction of optical power of the waveguide mode in the cladding and therefore the interaction with the cladding material. Since the cladding material exhibits a different thermo-optic coefficient than the core material, one can achieve different temperature responses in waveguides that guide modes with large interaction with the cladding material compared to waveguides with modes that exhibit a low interaction with the cladding material.

The two partial optical signals that define the two optical power transfer functions are either guided in two separate optical paths that create differing mode confinements for the optical modes of the partial optical signals (a single optical mode is guided within each of the optical paths) or in a single optical path, wherein each partial signal is realized by one of two differing modes and wherein the waveguide realizing the single optical path defines the differing confinements of the two differing modes. Of course, in the latter case the single optical waveguide is configured to guide at least the two optical modes.

Waveguides defining different confinements for the same type of mode, e.g. the $TE_{00}$ mode, are e.g. a "normal" waveguide having a cross-section comprising a single core region surrounded by a cladding (this waveguide type usually has a high mode confinement for the fundamental mode) and a slot waveguide having a cross-section comprising two neighboring core regions separated by a given distance (the slot), said structure surrounded by a cladding (this waveguide type usually has a low mode confinement for the fundamental mode). In order to make the two power transfer functions sufficiently different, it is preferred to maximize the difference of the mode confinements for the differing partial optical signals.

Of course, if the optical detection device shall be used as a temperature sensor for detecting the temperature of an arbitrary element or the (air) environment, the optical waveguide structure 102, 202 and 302 that serves as a temperature sensor must be thermally connected with the respective element or the environment. If the optical waveguide structure 102, 202 and 302 is realized in integrated optics, the waveguide structure is usually provided on an appropriate substrate, i.e. the substrate can be mechanically and thermally connected to the respective element. In applications in which the optical detection device serves as a temperature sensor only, there is no need to explicitly determine the absolute wavelength or the wavelength change. In other words, the temperature sensor realized in this way is capable of compensating for wavelength changes of the optical probe signal. Likewise, if the optical detection device is used as a sensor for detecting the wavelength or wavelength changes only, there is no need to explicitly determine the absolute temperature or temperature changes. In such applications, the optical detection device is capable of compensating for wavelength changes. However, the optical detection device according to the present invention can also be used as a sensor that is capable of detecting both the absolute temperature or temperature changes and the absolute wavelength or wavelength changes.

LIST OF REFERENCE SIGNS 100 optical detection device
102 optical waveguide structure
102a optical input port
102b first optical output port
102c second optical output port
104 optical transmitter
106 opto-electrical converter
108 opto-electrical converter
110 control device
112 optical 1×2 power splitter
114 optical waveguide
116 optical splitting path
118 optical splitting path
120 optical resonator
122 optical resonator
124 optical 1×3 power splitter
126 opto-electrical converter
128 optical reference path
200 optical detection device
202 optical waveguide structure
202a optical input port
202b first optical output port
202c second optical output port
212 optical 1×2 power splitter
214 optical waveguide
216 optical splitting path
218 optical splitting path
220 optical resonator
222 optical resonator
300 optical detection device
302 optical waveguide structure
302a optical input port
302b first optical output port
302c second optical output port
312 optical 1×2 mode splitter
314 optical path
316 optical splitting path
318 optical splitting path
320 optical resonator
330 optical waveguide structure/optical component (for creating two modes)
$F_1(\lambda,T)$ first power transfer function
$F_2(\lambda,T)$ second power transfer function
$F_{R1}(\lambda,T)$ power transfer function of first resonator
$F_{R2}(\lambda,T)$ power transfer function of second resonator
k splitting ratio of optical power splitter
$S_{probe}$ optical probe signal
$S_{d1,opt}$ optical detection signal
$S_{d2,opt}$ optical detection signal
$S_{dref,opf}$ optical detection signal
$S_{d1,el}$ electrical detection signal
$S_{d2,el}$ electrical detection signal
$S_{dref,el}$ electrical detection signal
T temperature
$T_0$, $T_1$ temperature values

The invention claimed is:

1. A method for detecting an absolute temperature or temperature changes and/or an absolute wavelength or wavelength changes of an optical probe signal using an optical detection device comprising an optical waveguide structure defining an optical input port adapted to receive the optical probe signal and a first and a second optical output port adapted to output a first and a second optical detection signal, respectively, as a response to the optical probe signal, the optical waveguide structure being configured in such a way that a first power transfer function characterizing a transmission of the optical probe signal from the optical input port to the first optical output port differs, with respect to its wavelength and temperature dependency, from a second power transfer function characterizing a transmission of the optical probe signal from the optical input port to the second optical output port, wherein the optical waveguide structure comprises an optical mode splitter that is configured to split an optical input path between the optical input port and a common port of the optical mode splitter into a first and a second optical splitting path between a first and a second optical splitting port of the optical mode splitter and the first and a second optical output port, wherein a single optical resonator is provided within the optical input path, wherein the optical input path is configured to guide, at least within an optical path portion between an input port of the optical resonator and the common port of the optical mode splitter, a first and a second optical mode having differing propagation properties and wherein the optical mode splitter is configured to direct an optical power portion of the optical signal fed to the common port of the optical mode splitter that is comprised by the first optical mode to the first optical splitting path and an optical power portion that is comprised by the second optical mode to the second optical splitting path, the method comprising the steps of:

(1) transmitting the optical probe signal having a predetermined wavelength to the optical input port, (2) detecting the first and second optical detection signal at the first and second optical output port by means of a first and a second opto-electrical converter which create a first and second electrical signal corresponding to an optical power of the respective first and second optical detection signal, (3) measuring values of the first and second electrical signal, and (4) determining an absolute temperature value or a value of a temperature change of the optical waveguide structure and/or an absolute wavelength value or a value of a wavelength change of the optical probe signal by using the values measured of the first and second electrical signal and a first and a second previously determined wavelength and temperature dependency of both the first and second power transfer function.

2. The method according to claim 1, wherein:
(a) the absolute temperature value determined or the value of a temperature change of the optical waveguide structure determined is used for further processing and/or
(b) the absolute wavelength value determined or the value of a wavelength change of the optical probe signal determined is used for controlling a wavelength of an optical transmitter creating the optical probe signal.

3. The method according to claim 1, wherein the first and second wavelength and temperature dependency of the first and second power transfer function is are previously determined by means of a calibration process, wherein the calibration process comprises one of the following steps:

(a) according to a brute force method, measuring values of the first and second electrical signal of step (3) while varying a temperature and a wavelength within a respective predetermined temperature and wavelength range, or (b) according to a simulation method, performing a multi-dimensional simulation in order to determine simulated dependencies of the first and second power transfer function that depend on temperature and wavelength as well as on a respective n-dimensional parameter vector p and q, measuring values of the first and second electrical signal of step (3) for one or more predetermined pairs of values of temperature and wavelength and analytically or numerically calculating the vectors p and q using the simulated dependencies and the values measured, or (c) according to an analytical method, determining exact or approximate analytical dependencies of the first and second power transfer function that depend on temperature and wavelength as well as on a respective n-dimensional parameter vector p and q, measuring values of the first and second electrical signal of step (3) for one or more predetermined pairs of values of temperature and wavelength and determining the vectors p and q using the exact or approximate analytical dependencies and the values measured.

4. The method according to claim 2, wherein:
(a) the absolute temperature value determined or the value of a temperature change of the optical waveguide structure determined is used for further processing, and/or
(b) the absolute wavelength value determined or the value of a wavelength change of the optical probe signal determined is used for controlling a wavelength of an optical transmitter creating the optical probe signal.

5. An optical detection device for detecting an absolute temperature or temperature changes and/or an absolute wavelength or wavelength changes of an optical probe signal, the optical detection device comprising:

(a) an optical waveguide structure defining an optical input port adapted to receive an optical probe signal and a first and a second optical output port adapted to output a first and a second optical detection signal, respectively, as a response to the optical probe signal, (b) the optical waveguide structure being configured in such a way that a first power transfer function characterizing a transmission of the optical probe signal from the optical input port to the first optical output port differs, with respect to its temperature wavelength and dependency, from a second power transfer function characterizing the transmission of the optical probe signal from the optical input port to the second optical output port;

(c) a first and a second opto-electrical converter which are configured to detect the first and second optical detection signal at the first and second optical output port and to create a respective first and second electrical signal corresponding to an optical power of the respective first or second optical detection signal;

(d) a control device which is configured
(i) to receive the first and second electrical signal and to obtain measured values of the first and second electrical signal, and
(ii) to determine an absolute temperature value or a value of a temperature change of the optical waveguide structure and/or an absolute wavelength value or a value of a wavelength change of the optical probe signal by using the values measured of the first and second electrical signal and a first and a second previously determined wavelength and temperature dependency of both the first and second power transfer function, wherein the optical waveguide structure is configured in such a way that at least one optical resonator structure is provided within optical paths between the optical input port and the first and second optical output port; and the optical waveguide structure comprises an optical mode splitter that is configured to split an optical input path between the optical input port and a common port of the optical mode splitter into a first and a second optical splitting path between a first and a second optical splitting port of the optical mode splitter and the first and a second optical output port, wherein a single optical resonator is provided within the optical input path, wherein the optical input path is configured to guide, at least within an optical path portion between an input port of the optical resonator and the common port of the optical mode splitter, a first and a second optical mode having differing propagation properties and wherein the optical mode splitter is configured to direct an optical power portion of the optical signal fed to the common port of the optical mode splitter that is comprised by the first optical mode to the first optical splitting path and an optical power portion that is comprised by the second optical mode to the second optical splitting path.

6. The optical detection device according to claim 5, wherein the optical input port of the optical waveguide structure is configured in such a way that the first and the second optical mode are excited in the optical input path as a response to feeding the optical probe signal to the optical input port.

7. The optical detection device according to claim 5, wherein the optical waveguide structure comprises, within the optical input path between the optical input port and the optical resonator, an optical waveguide structure or an optical component that is configured to create the first and second optical mode as a response to the optical probe signal.

8. The optical detection device according to claim 5, wherein the first and second optical modes are ordinary modes of different orders or orthogonally polarized modes of identical or differing order or differing optical vortex beams with different optical angular momentum or different spin angular momentum.

9. The optical detection device according to claim 5, wherein the control device is configured to carry out a method for detecting the absolute temperature or temperature changes and/or the absolute wavelength or wavelength changes, the method comprising the steps of:

(1) transmitting the optical probe signal having a predetermined wavelength to the optical input port, (2) detecting the first and second optical detection signal at the first and second optical output port by means of a first and a second opto-electrical converter which create a first and second electrical signal corresponding to the optical power of the respective first and second optical detection signal, (3) measuring values of the first and second electrical signal, and (4) determining an absolute temperature value or a value of a temperature change of the optical waveguide structure and/or an absolute wavelength value or a value of a wavelength change of the optical probe signal by using the values measured of the first and second electrical signal and a first and a second previously determined wavelength and temperature dependency of both the first and second power transfer function.

* * * * *

UNITED STATES PATENT AND TRADEMARK OFFICE
CERTIFICATE OF CORRECTION

PATENT NO. : 11,846,559 B2
APPLICATION NO. : 17/545202
DATED : December 19, 2023
INVENTOR(S) : Benjamin Wohlfeil et al.

It is certified that error appears in the above-identified patent and that said Letters Patent is hereby corrected as shown below:

In the Claims

Column 19, Line 44, Claim 2, delete "processing" and insert -- processing, --

Column 19, Line 52, Claim 3, delete "is are" and insert -- are --

Signed and Sealed this
Thirteenth Day of February, 2024

Katherine Kelly Vidal
*Director of the United States Patent and Trademark Office*